United States Patent
Oh et al.

(10) Patent No.: US 7,205,219 B2
(45) Date of Patent: Apr. 17, 2007

(54) METHODS OF FORMING INTEGRATED CIRCUITS DEVICES HAVING PAD CONTACT PLUGS IN THE CELL ARRAY AND PERIPHERAL CIRCUIT REGIONS OF THE INTEGRATED CIRCUIT SUBSTRATE

(75) Inventors: Se-Hoon Oh, Chungcheongnam-do (KR); Jung-Hee Chung, Seoul (KR); Jae-Hyoung Choi, Gyeonggi-do (KR); Jeong-Sik Choi, Seoul (KR); Sung-Tae Kim, Seoul (KR); Cha-Young Yoo, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/823,221

(22) Filed: Apr. 13, 2004

(65) Prior Publication Data

US 2004/0219744 A1    Nov. 4, 2004

(30) Foreign Application Priority Data

Apr. 30, 2003  (KR) .................. 10-2003-0027556

(51) Int. Cl.
*H01L 21/44* (2006.01)
(52) U.S. Cl. .............................. 438/597; 257/E21.537
(58) Field of Classification Search ........ 438/238–240, 438/244, 250, 253–255, 329–330, 381–382, 438/384, 393, 396–397, 399, 637, 652–653, 438/672, 675, 597; 257/E21.537, E21.538, 257/E21.539
See application file for complete search history.

(56) References Cited

U.S. PATENT DOCUMENTS

| | | | |
|---|---|---|---|
| 6,040,209 A * | 3/2000 | Roberts ..................... | 438/238 |
| 6,500,724 B1 * | 12/2002 | Zurcher et al. ............. | 438/384 |
| 6,656,791 B2 * | 12/2003 | Shin et al. .................. | 438/253 |
| 6,690,082 B2 * | 2/2004 | Lakshmikumar ........... | 257/536 |
| 6,693,002 B2 * | 2/2004 | Nakamura et al. .......... | 438/238 |
| 6,696,368 B2 * | 2/2004 | Derraa et al. ............... | 438/761 |
| 6,818,469 B2 * | 11/2004 | Mori et al. ................... | 438/52 |
| 2003/0042607 A1 * | 3/2003 | Derraa et al. ............... | 257/751 |
| 2003/0075802 A1 * | 4/2003 | Derraa et al. ............... | 257/758 |
| 2003/0199152 A1 * | 10/2003 | Derraa ........................ | 438/471 |
| 2004/0262661 A1 * | 12/2004 | Kim et al. .................. | 257/303 |

* cited by examiner

*Primary Examiner*—Walter Lindsay, Jr.
*Assistant Examiner*—Stanetta Isaac
(74) *Attorney, Agent, or Firm*—Myers Bigel Sibley & Sajovec

(57) ABSTRACT

Integrated circuit devices, for example, dynamic random access memory (DRAM) devices, are provided including an integrated circuit substrate having a cell array region and a peripheral circuit region. A buried contact plug is provided on the integrated circuit substrate in the cell array region and a resistor is provided on the integrated circuit substrate in the peripheral circuit region. A first pad contact plug is provided on the buried contact plug in the cell array region and a second pad contact plug is provided on the resistor in the peripheral circuit region. An ohmic layer is provided between the first pad contact plug and the buried contact plug and between the second pad contact plug and the resistor. Related methods of fabricating integrated circuit devices are also provided.

19 Claims, 8 Drawing Sheets

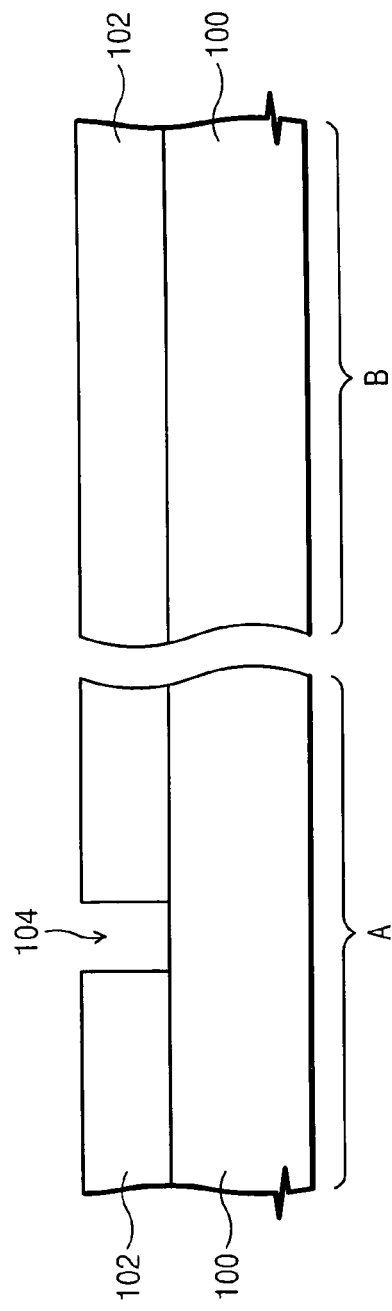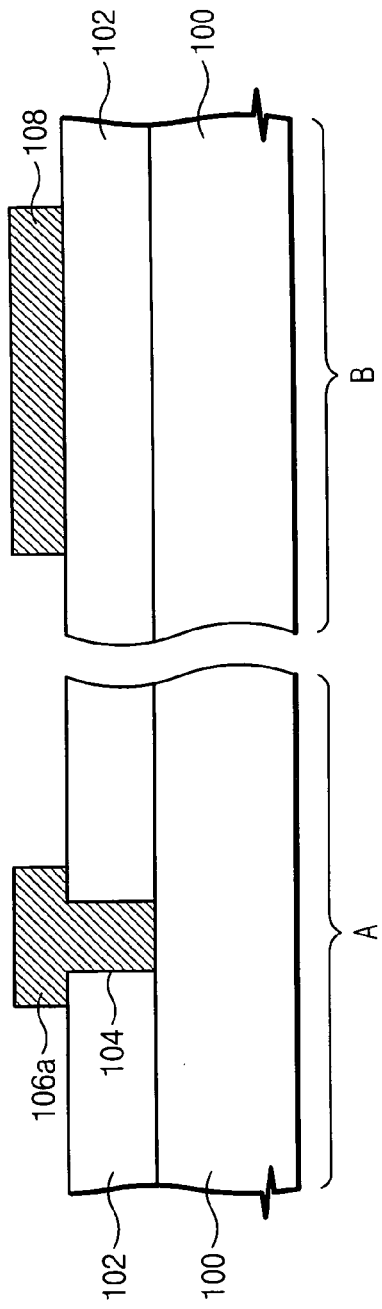

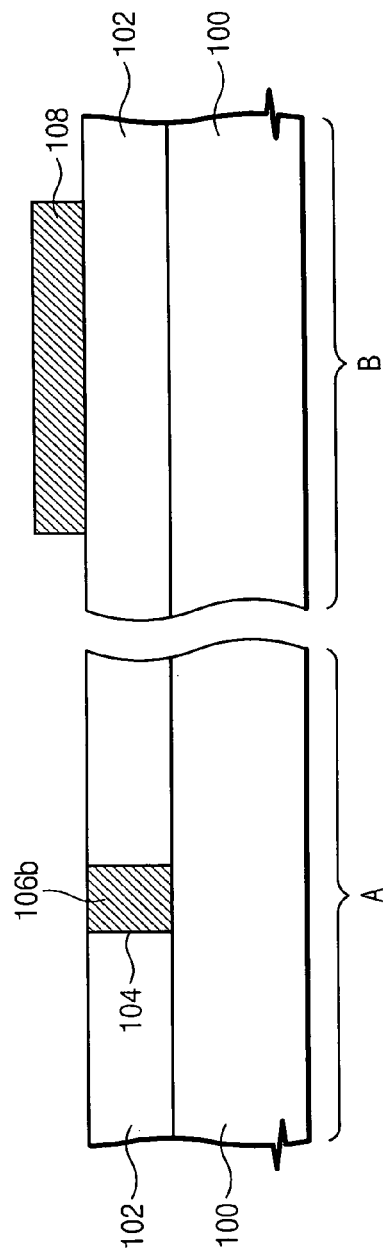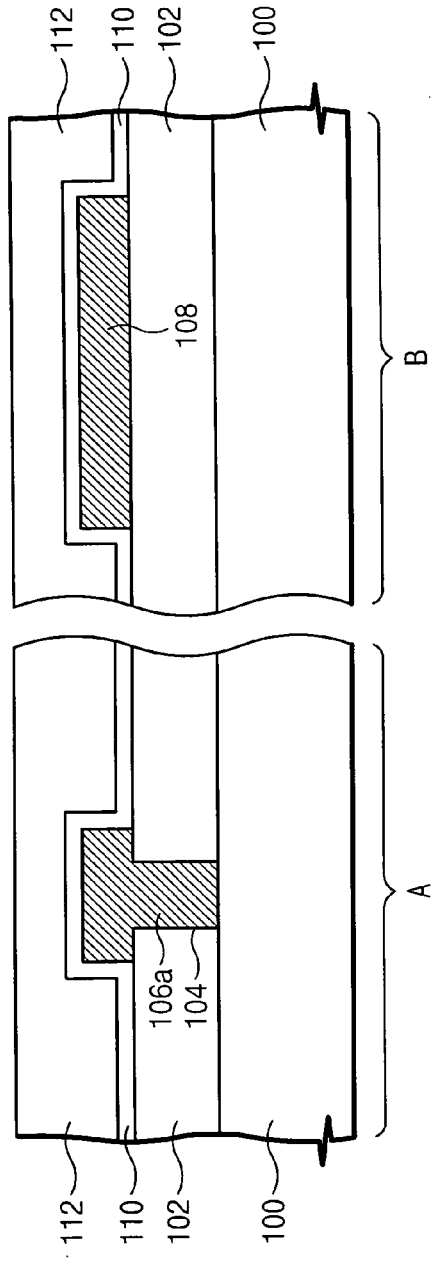

METHODS OF FORMING INTEGRATED CIRCUITS DEVICES HAVING PAD CONTACT PLUGS IN THE CELL ARRAY AND PERIPHERAL CIRCUIT REGIONS OF THE INTEGRATED CIRCUIT SUBSTRATE

RELATED APPLICATION

This application is related to and claims priority from Korean Patent Application No. 2003-27556 filed on Apr. 30, 2003, the disclosure of which is hereby incorporated herein by reference as if set forth in its entirety.

FIELD OF THE INVENTION

The present invention relates to integrated circuit devices and methods of forming the same and, more particularly, to integrated circuit devices including resistors and methods of forming the same.

BACKGROUND OF THE INVENTION

In conventional integrated circuit devices, for example, memory devices such as dynamic random access memory (DRAM) devices, that include resistors, the resistors are typically formed of impurity-doped polysilicon because changing the doping concentration of the impurities can control a resistance of the resistor. Referring now to FIG. 1, a conventional process of fabricating conventional integrated circuit devices including resistors will be discussed.

As illustrated in FIG. 1, a lower interlayer dielectric layer 3 is formed on an integrated circuit substrate 1. The substrate 1 is divided into a cell array region A and a peripheral circuit region B. In the cell array region A, the lower interlayer dielectric layer 3 is patterned to form a contact hole that exposes at least a portion of a surface of the integrated circuit substrate 1. A conductive material may be deposited in the contact hole to form a buried contact plug 5. A first etch stop layer 7 and a first interlayer dielectric layer 9 are formed on the buried contact plug 5 and the lower interlayer dielectric layer 3. In the cell array region A, the first interlayer dielectric layer 9 and the first etch stop layer 7 are patterned to form a pad contact hole that exposes at least a portion of the buried contact plug 5. Simultaneously, in the peripheral circuit region B, the first interlayer dielectric layer 9 may be removed. A conductive material may be deposited in the pad contact hole to form a pad contact plug 11. In the peripheral circuit region B, the conductive material may be removed so that at least a portion of the lower interlayer dielectric layer 3 is exposed. An impurity-doped polysilicon layer is formed on a surface of the integrated circuit substrate 1 and patterned to form a resistor 15 in the peripheral circuit region B. Simultaneously, in the cell array region A, the impurity-doped polysilicon layer may be removed to expose the first interlayer dielectric layer 9 and the pad contact plug 11. A second etch stop layer 17 is formed on a surface of the integrated circuit substrate 1 including the resistor 15. A lower electrode 18 is formed on the integrated circuit substrate 1. The lower electrode 18 may be electrically coupled to the pad contact plug 11 through the second etch stop layer 17. A dielectric layer 19 and an upper electrode 21 are conformally formed on the lower electrode 18 to form a capacitor. In the peripheral circuit region B, the upper electrode 21 may be removed using, for example, a patterning process. A second interlayer dielectric layer 23 may be formed on the capacitor and the second etch stop layer 17. In the peripheral circuit region B, the second interlayer dielectric layer 23 and the second etch stop layer 17 are sequentially patterned to form a metal contact hole 24 that exposes at least a portion of the resistor 15.

An ohmic layer 26 is formed in the bottom of the metal contact hole 24 that may reduce a resistance difference between the metal of the metal contact plug and the polysilicon of the resistor 15. In particular, a metal layer, for example, titanium, may be conformally formed in the metal contact hole 24 and, for example, a rapid thermal process may be performed at a temperature greater than about 600 degrees Celsius. The polysilicon of the resistor 15 may react with the metal layer to form the ohmic layer 26 of metal silicide, for example, titanium silicide. A metal contact plug may be formed in the metal contact hole 24 on the ohmic layer 26. However, during the rapid thermal process at the temperature greater than about 600 degrees Celsius, the dielectric layer 19 of the capacitor in the cell array region may be damaged, which may cause a leakage current of the capacitor to increase during operation of the integrated circuit device. Accordingly, the overall reliability of the integrated circuit device may be reduced.

SUMMARY OF THE INVENTION

Embodiments of the present invention provide integrated circuit devices, for example, integrated circuit memory devices, including an integrated circuit substrate having a cell array region and a peripheral circuit region. A buried contact plug is provided on the integrated circuit substrate in the cell array region and a resistor is provided on the integrated circuit substrate in the peripheral circuit region. A first pad contact plug is provided on the buried contact plug in the cell array region and a second pad contact plug is provided on the resistor in the peripheral circuit region. An ohmic layer is provided between the first pad contact plug and the buried contact plug and between the second pad contact plug and the resistor.

In some embodiments of the present invention, the integrated circuit device may further include a lower interlayer dielectric layer on the integrated circuit substrate. The lower interlayer dielectric layer may define a contact hole in the cell array region. The buried contact plug may be disposed in the contact hole and the resistor may be disposed on the lower interlayer dielectric layer. A first interlayer dielectric layer may also be provided on the lower interlayer dielectric layer, the buried contact plug and the resistor. The first interlayer dielectric layer may define a first pad contact hole in the cell array region and a second pad contact hole in the peripheral circuit region. The first and second pad contact plugs may be disposed in the first and second pad contact holes, respectively.

In further embodiments of the present invention, the integrated circuit device may further include a capacitor including a lower electrode on the first pad contact plug, a capacitor dielectric layer on the lower electrode, and an upper electrode on the capacitor dielectric layer. A second interlayer dielectric layer may be provided on the capacitor and the first interlayer dielectric layer. The second interlayer dielectric layer may define a metal contact hole in the peripheral circuit region. A metal contact plug may be provided in the metal contact hole in the peripheral circuit region.

In still further embodiments of the present invention, the integrated circuit device may further include an etch stop layer between the first interlayer dielectric layer and the second interlayer dielectric layer. In certain embodiments of the present invention, the ohmic layer may include at least one of titanium silicide (TiSi), tantalum silicide (TaSi), cobalt silicide (CoSi) and nickel silicide (NiSi).

In some embodiments of the present invention, the integrated circuit device may further include a first adhesion layer between the first pad contact plug and the first interlayer dielectric layer, between the first pad contact plug and the buried contact plug, between the second pad contact plug and the first interlayer dielectric layer, and between the second pad contact plug and the resistor. A second adhesion layer may also be provided between the metal contact plug and the second interlayer dielectric layer and between the metal contact plug and the second pad contact plug. In certain embodiments of the present invention, the first pad contact plug, the second pad contact plug and the metal contact plug may include at least one of tungsten, aluminum, copper, doped polysilicon and undoped polysilicon. In some embodiments of the present invention, the buried contact plug and the resistor include the same material.

While the present invention is described above primarily with reference integrated circuit devices, methods of forming integrated circuit devices are also provided herein.

BRIEF DESCRIPTION OF THE DRAWINGS

FIGS. 3 through 10 are cross-sections illustrating processing steps in the fabrication of integrated circuit devices according to embodiments of the present invention.

DETAILED DESCRIPTION

Figure 1:
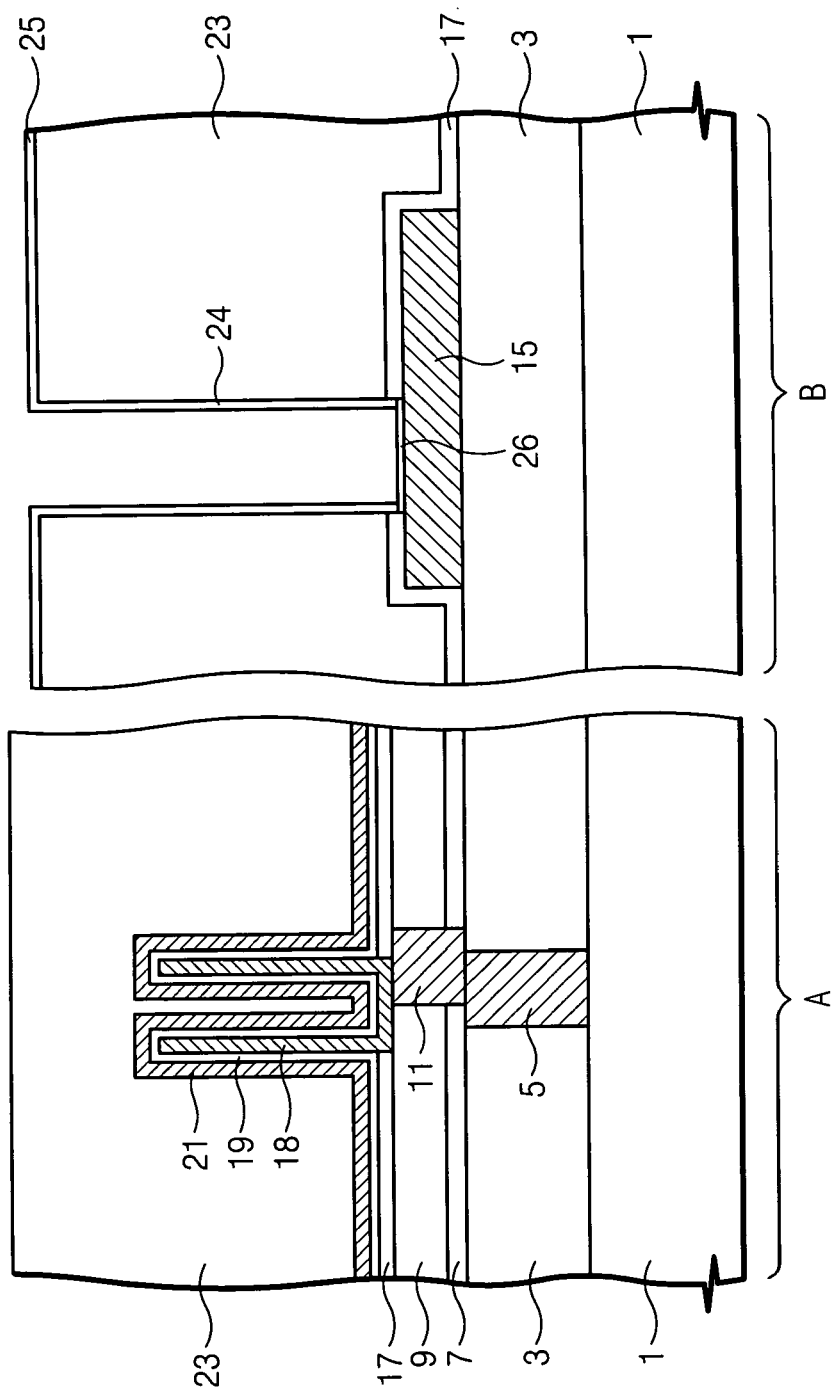
FIG. 1 is a cross-section illustrating conventional integrated circuit devices that include resistors.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. It will be understood that when an element such as a layer, region or substrate is referred to as being "on" another element, it can be directly on the other element or intervening elements may also be present. It will be understood that when an element such as a layer, region or substrate is referred to as "under" or "beneath" another element, it can be directly under the other element or intervening elements may also be present. Like numbers refer to like elements throughout.

Furthermore, relative terms, such as beneath, may be used herein to describe an element's relationship to another as illustrated in the Figures. It will be understood that these terms are intended to encompass different orientations of the elements in addition to the orientation depicted in the Figures. For example, if a Figure is inverted, the elements described as "beneath" other elements would be oriented "above" these other elements. The relative terms are, therefore, intended to encompass all possible arrangements of the elements and not just the ones shown in the Figures.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

Embodiments of the present invention will be described below with respect to FIGS. 2 through 10. Embodiments of the present invention provide integrated circuit devices, for example, dynamic random access memory (DRAM) devices, including an integrated circuit substrate having a cell array region and a peripheral circuit region. A buried contact plug is provided on the cell array region of the integrated circuit substrate and a resistor is provided on the peripheral circuit region of the integrated circuit substrate. The buried contact plug and the resistor may include the same material, which may simplify the fabrication process of the integrated circuit device. Furthermore, an ohmic layer is provided on the buried contact plug and on the resistor. The ohmic layer is formed prior to the formation of a capacitor dielectric layer in the cell array region. Accordingly, the capacitor dielectric layer may not be damaged during a rapid thermal process used to form the ohmic layer. Thus, improved integrated circuit devices may be provided according to embodiments of the present invention as discussed further herein.

Figure 2:
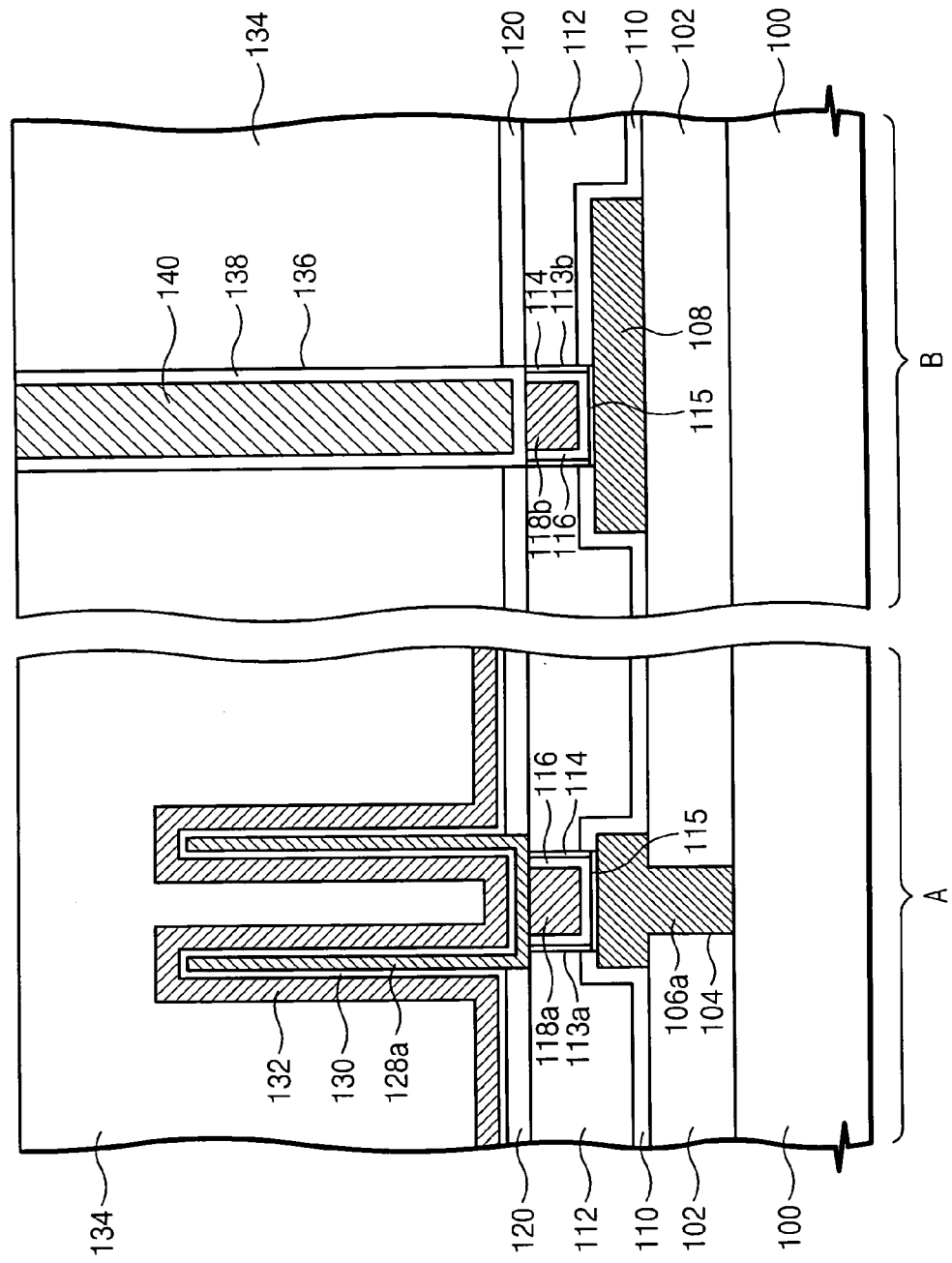
FIG. 2 is a cross-section illustrating integrated circuit devices including resistors according to embodiments of the present invention.

Referring now to FIG. 2, a cross-section illustrating integrated circuit devices according to embodiments of the present invention will be discussed. As illustrated in FIG. 2, a lower interlayer dielectric layer 102 is provided on an integrated circuit substrate 100. The integrated circuit substrate 100 includes a cell array region A and a peripheral circuit region B. A contact hole 104 is provided in the lower interlayer dielectric layer 102 that exposes the integrated circuit substrate 100 in the cell array region A. A buried contact plug 106a is provided in the contact hole 104 and is electrically coupled to the integrated circuit substrate 100. The buried contact plug 106a may only be provided in the contact hole 104 or may be provided in the contact hole 104 and on the lower interlayer dielectric layer 102 as illustrated in, for example, FIG. 2.

A resistor 108 is provided on the lower interlayer dielectric layer 102 in the peripheral circuit region B. The resistor 108 and the buried contact plug 106a may include the same material, for example, an impurity-doped polysilicon. A first etch stop layer 110 is provided on the resistor 108, the buried contact plug 106a and the lower interlayer dielectric layer 102. A first interlayer dielectric layer 112 is provided on the first etch stop layer 110. A first pad contact hole 113a is provided in the first interlayer dielectric layer 112 and the first etch stop layer 110 in the cell array region A. At least a portion of the buried contact plug 106a is exposed through the first pad contact hole 113a. A second pad contact hole 113b is provided in the first interlayer dielectric layer 112 and the first etch stop layer 110 in the peripheral circuit region B. At least a portion of the resistor 108 is exposed through the second pad contact hole 113b. A metal layer 114 is provided on sidewalls of the first and second pad contact holes 113a and 113b and an ohmic layer 115 is provided on a bottom surface of the pad contacts holes 113a and 113b. A first adhesion layer 116 may be formed on the metal layer 114 and the ohmic layer 115. The metal layer 114 may include, for example, titanium, tantalum, cobalt and/or nickel, and the ohmic layer 1115 may include, for example, a silicide of the metal.

First and second pad contact plugs 118a and 118b may be provided in the first and second pad contact holes 113a and 113b, respectively. A second etch stop layer 120 may be provided on the first interlayer dielectric layer 112 and the first and second pad contact plugs 118a and 118b. The first and second etch stop layers 110 and 120 may include, for example, silicon nitride. In certain embodiments of the present invention, a wet-etch stop layer (not shown) may be provided on the second etch stop layer 120. A lower electrode 128a, for example, having a cylindrical shape, is provided on the first pad contact plug 118a through the second etch stop layer 120 in the cell array region A. A dielectric layer 130 and an upper electrode 132 are provided on the lower electrode 128a. The lower electrode 128a, the dielectric layer 130 and the upper electrode 132 form a capacitor in the cell array region A. The lower electrode 128a and the upper electrode 132 may include, for example, titanium nitride. The dielectric layer 130 may include, for example, hafnium oxide.

A capping layer of, for example, tungsten, may be provided on the upper electrode 132. A second interlayer dielectric layer 134 is provided on the capacitor in the cell array region A and the second etch stop layer 120 in the peripheral circuit region B. A metal contact hole 136 is provided in the second interlayer dielectric layer 134 and the second etch stop layer 120 that exposes the second pad contact plug 118b in the peripheral circuit region B. A second adhesion layer 138 is provided on sidewalls and a bottom of the metal contact hole 136. The first and second adhesion layers 116 and 138 may include, for example, titanium nitride. A metal contact plug 140 is provided in the metal contact hole 136. The first and second pad contact plugs 118a and 118b and the metal contact plug 140 may include, for example, tungsten, aluminum, copper, doped polysilicon and/or undoped polysilicon.

In embodiments of the present invention discussed above, the ohmic layer 115 and the first and second pad contact plugs 118a and 18b are provided in the first and second pad contact holes 113a and 113b in the first interlayer dielectric layer 112. Accordingly, the ohmic layer 115 may be formed before the capacitor is formed. In other words, the temperature of greater than about 600 degrees Celsius used when forming the ohmic layer 115 may not damage the dielectric layer 130 formed after the ohmic layer 115. Thus, it may be possible to reduce the likelihood that the leakage current will increase and degrade the reliability of the integrated circuit device.

Referring now to FIGS. 3 through 10, cross-sections illustrating processing steps in the fabrication of integrated circuit devices according to embodiments of the present invention will be discussed. As illustrated in FIG. 3, an integrated circuit substrate 100 is divided into two regions, a cell array region A and a peripheral circuit region B. A lower interlayer dielectric layer 102 is formed on the integrated circuit substrate 100. The lower interlayer dielectric layer 102 may include, for example, silicon oxide. Field oxides and transistors (not shown) having gate patterns and impurity-doped regions may be formed on the integrated circuit substrate 100 before forming the lower interlayer dielectric layer 102. The lower interlayer dielectric layer 102 is patterned in the cell array region A to form a contact hole 104 that exposes at least a portion of the integrated circuit substrate 100.

Referring now to FIGS. 4 and 5, a first conductive layer is formed in the contact hole 104 and on a surface of the lower interlayer dielectric layer 102. The first conductive layer is patterned to form a buried contact plug 106a or 106b (FIG. 5) in the contact hole 104 in the cell array region A. As illustrated in FIG. 4, the buried contact plug 106a may be in the contact hole 104 and on the lower interlayer dielectric layer 102. Although embodiments of the present invention are discussed herein with respect to FIGS. 6 through 10 as having a buried contact plug 106a as illustrated in FIG. 4, embodiments of the present invention are not limited to this configuration. For example, as illustrated in FIG. 5, the buried contact plug 106b may only be in the contact hole 104 and have a surface that is substantially planar with the lower interlayer dielectric layer 102 without departing from the scope of the present invention. Simultaneously, a resistor 108 may be formed on a portion of the lower interlayer dielectric layer 102 in the peripheral circuit region B. The first conductive layer may include, for example, an impurity-doped polysilicon having a thickness of about 1500 Å. In certain embodiments of the present invention, the resistance of the resistor 108 may be controlled by changing the doping concentration of the impurities.

Referring now to FIG. 6, a first etch stop layer 110 is formed on a surface of the integrated circuit substrate 100 including the resistor 108 and the buried contact plug 106a of FIG. 4. The first etch stop layer 110 may include, for example, silicon nitride having a thickness of about 150 Å. A first interlayer dielectric layer 112 is formed on the first etch stop layer 100 and planarized. The first interlayer dielectric layer 112 may be formed of, for example, high density plasma (HDP) oxide having a thickness of about 2000 Å.

Figure 7:
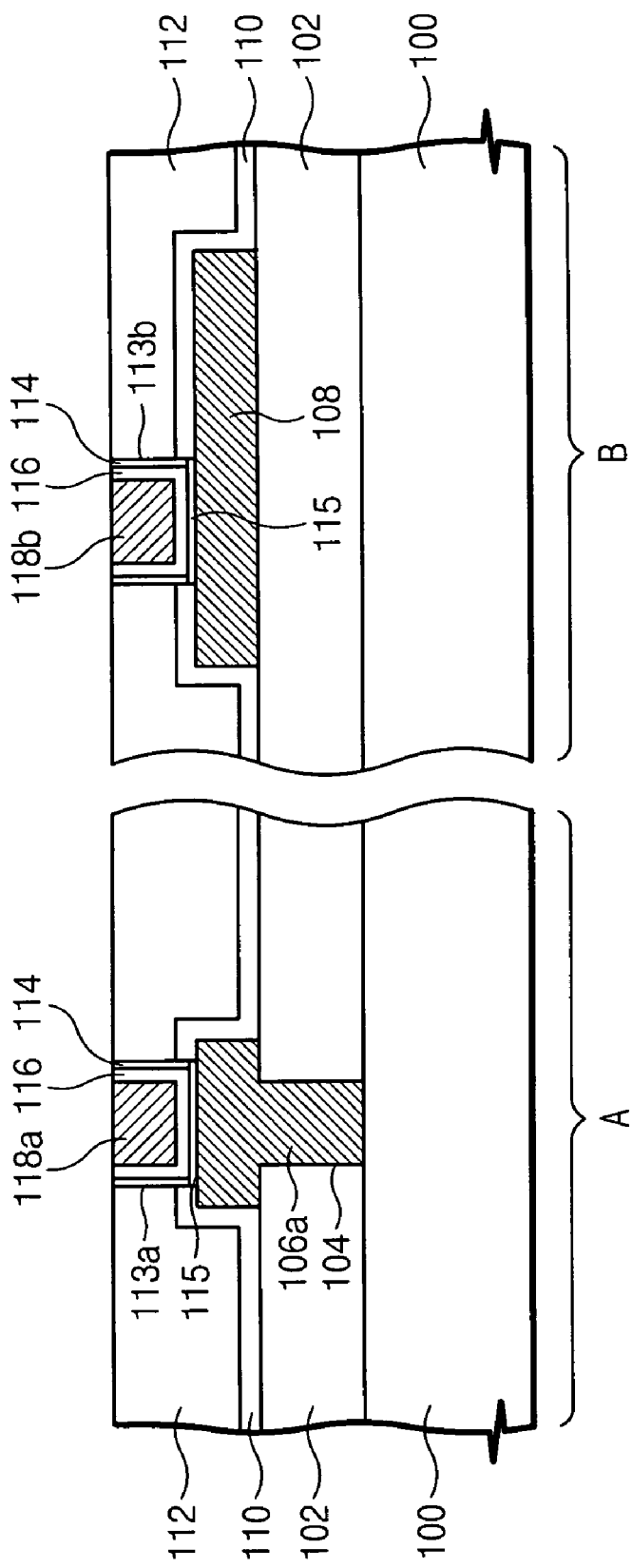

Referring now to FIG. 7, the first interlayer dielectric layer 112 and the first etch stop layer 110 are patterned to form a first pad contact hole 113a exposing the buried contact plug 106a in the cell array region A and a second pad contact hole 113b exposing the resistor 108 in the peripheral circuit region B. A metal layer 114 is formed having a thickness of about 85 Å on a surface of the integrated circuit substrate 100 including the first and second pad contact holes 113a and 113b. The metal layer 114 may include, for example, titanium (Ti), tantalum (Ta), cobalt (Co) and/or nickel (Ni). A rapid thermal process is performed with respect to the metal layer 114 at a temperature of about 650 degrees Celsius for about 15 seconds, thereby forming an ohmic layer 115 of metal silicide at boundaries between the metal layer 114 and the buried contact plug 106a and between the metal layer 114 and the resistor 108. The metal layer 114 may be formed using, for example, a sputtering method, physical vapor deposition (PVD) and/or chemical vapor deposition (CVD). In the case that the metal layer 114 is formed using a CVD method, the deposition temperature may be about 650 degrees Celsius and the metal layer 114 and the ohmic layer 115 may be simultaneously formed at the boundaries without the rapid thermal process.

A first adhesion layer 116 is formed of, for example, titanium nitride having a thickness of about 250 Å on the ohmic layer 115 and the metal layer 114. A second conductive layer is deposited having a thickness of about 2000 Å in the first and second pad contact holes 113a and 113b. A planarization process is performed with respect to the second conductive layer, the first adhesion layer 116 and the metal layer 114, thereby exposing the first interlayer dielectric layer 112 and simultaneously forming first and second pad contact plugs 118a and 118b in the first and second pad contact holes 113a and 113b, respectively. The second conductive layer may include, for example, tungsten, copper, aluminum, doped polysilicon and/or undoped polysilicon.

Figure 8:
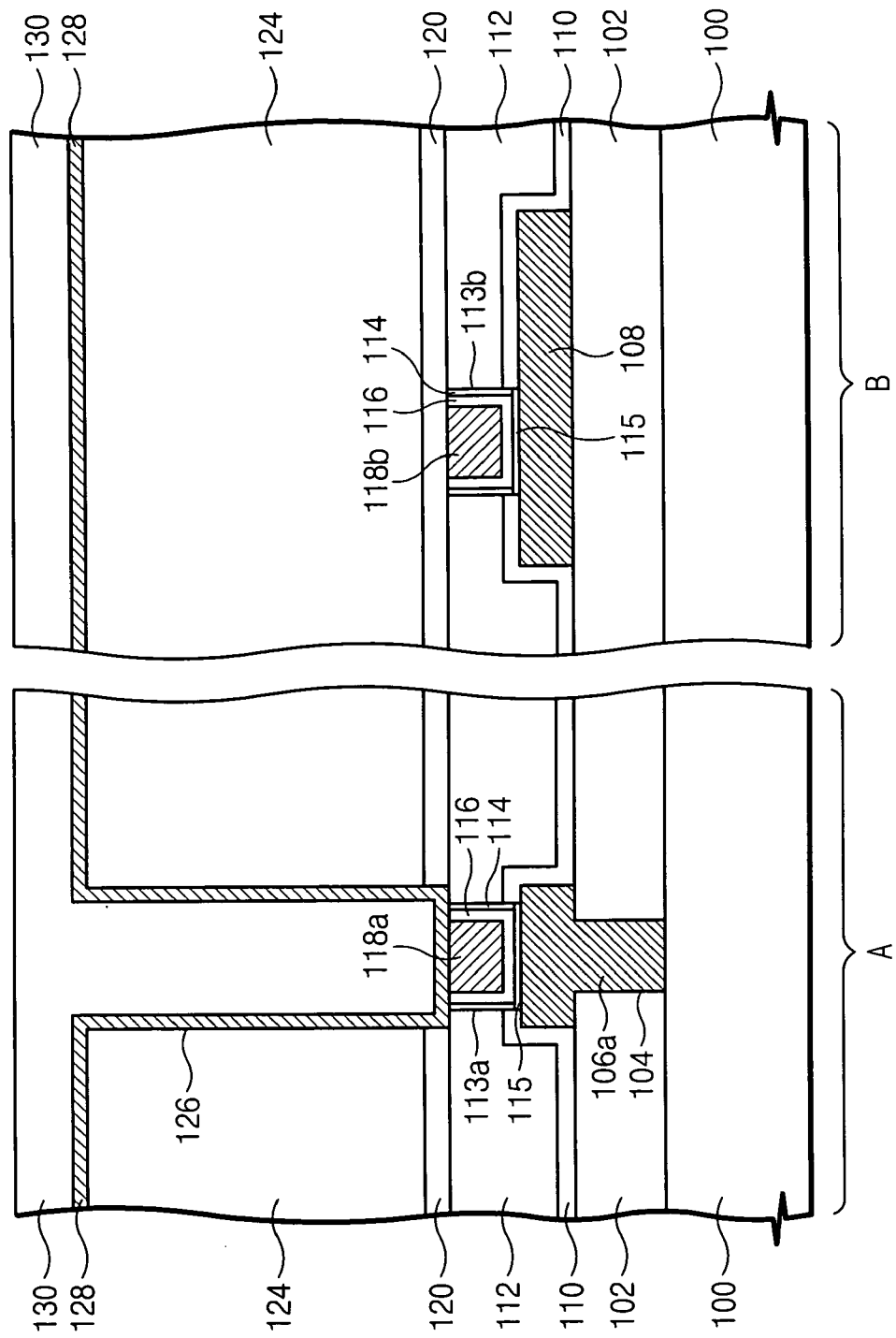

Referring now to FIG. 8, a second etch stop layer 120 and a mold layer 124 are sequentially formed on a surface of the integrated circuit substrate including the first and second pad contact plugs 118a and 118b. The second etch stop layer 120 may include, for example, silicon nitride having a thickness of about 500 Å. In certain embodiments of the present invention, a wet-etch stop layer (not shown) may be formed of tantalum oxide with a thickness of about 90 Å on the second etch stop layer 120. The wet-etch stop layer may function as an etch stopper when the mold layer 124 is removed by a wet-etch process. The mold layer 124 includes, for example, a single layer of boron phosphorus silicate glass (BPSG), plasma-enhanced tetraethyl orthosilicate (PETEOS), Tetraethyl orthosilicate (Si(OC2H5)$_4$) and/or a dual layer of BPSG and PETEOS. In the embodiments of the present invention having a mold layer 124 including a dual layer of BPSG and PETEOS, the thickness of BPSG may be about 5000 Å and the thickness of PETEOS may be about 12000 Å. In the cell array region A, the mold layer 124 and the second etch stop layer 120 are sequentially patterned to form a storage node hole 126 exposing the first pad contact plug 118a. A lower electrode layer 128 is formed along a profile of the storage node hole 126, and a sacrificial layer 130 is formed in the storage node hole 126. The lower electrode layer 128 may include, for example, titanium nitride having a thickness of about 300 Å. The lower electrode layer 128 may be formed using, for example, a CVD method. The sacrificial layer 130 may include, for example, hydrogen silsesquioxane (HSQ) or undoped silicate glass (USG).

Figure 9:
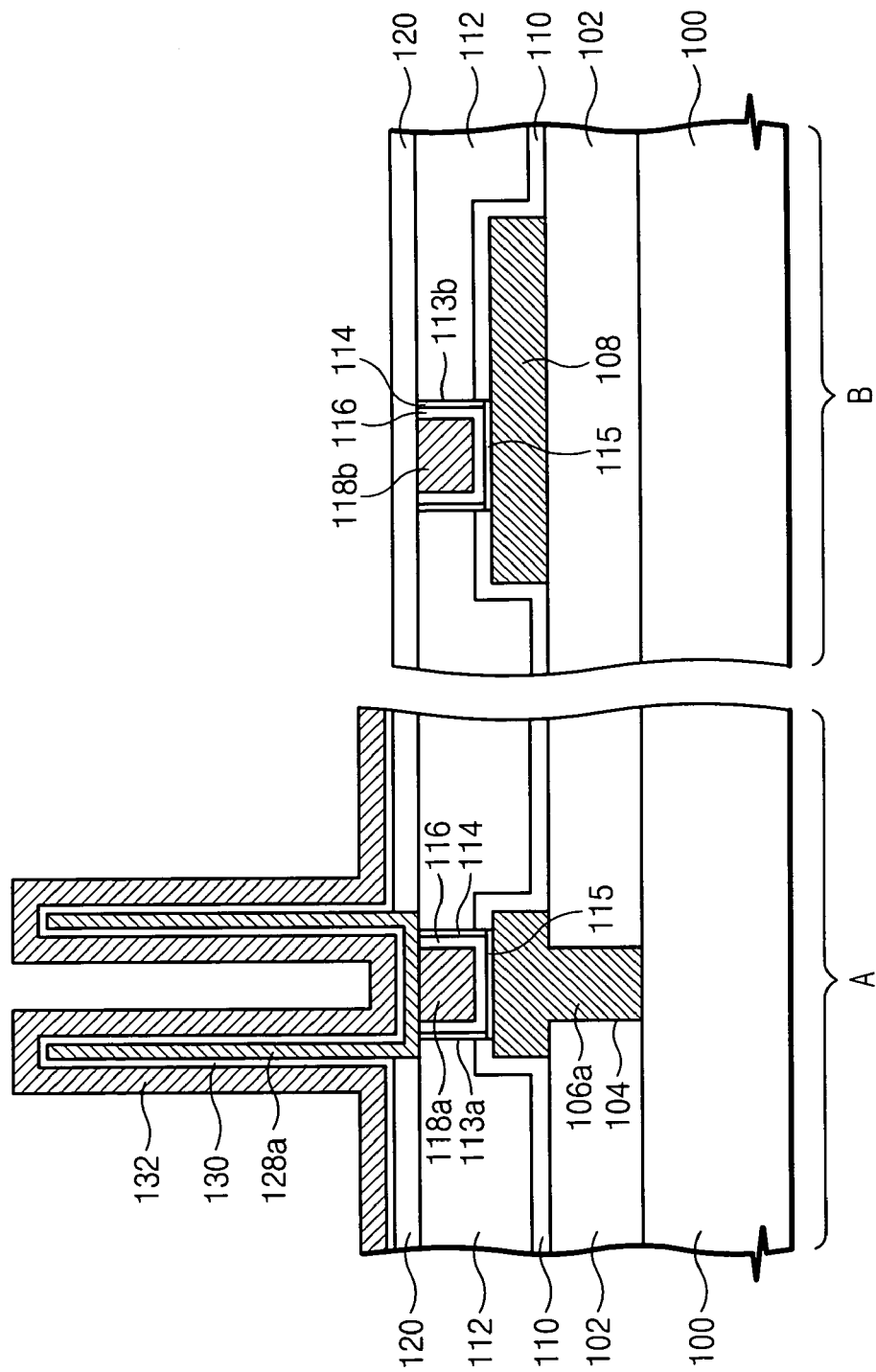

Referring now to FIG. 9, a planarization process is performed with respect to the sacrificial layer 130 and the lower electrode layer 128 to remove the sacrificial layer 130 and the lower electrode layer 128 on the mold layer 124. Therefore, the mold layer 124 is exposed and a lower electrode 128a and a sacrificial pattern (not shown) are formed in the storage node hole 126. The sacrificial pattern is removed by, for example, a wet etch process. The mold layer 124 may also be removed by, for example, a wet etch process to complete the lower electrode 128a having a cylinder shape. The lower electrode 128a may be electrically coupled to the first pad contact plug 118a. The mold layer 124 may be removed using a solution containing, for example, NH$_4$F and deionized water. A dielectric layer 130 and an upper electrode layer 132 are formed along a profile of the lower electrode 128a. The dielectric layer 130 may include, for example, hafnium oxide. The upper electrode layer 132 may include, for example, titanium nitride having a thickness of about 400 Å. A capping layer (not shown) may be formed on the upper electrode 132 in order to protect the upper electrode layer 132 and may include, for example, tungsten having a thickness of about 1000 Å. In the peripheral circuit region B, at least the upper electrode layer 132 is removed using, for example, a patterning process. The lower electrode 128a, the dielectric layer 130 and the upper electrode 132 form a capacitor in the cell array region A.

Figure 10:
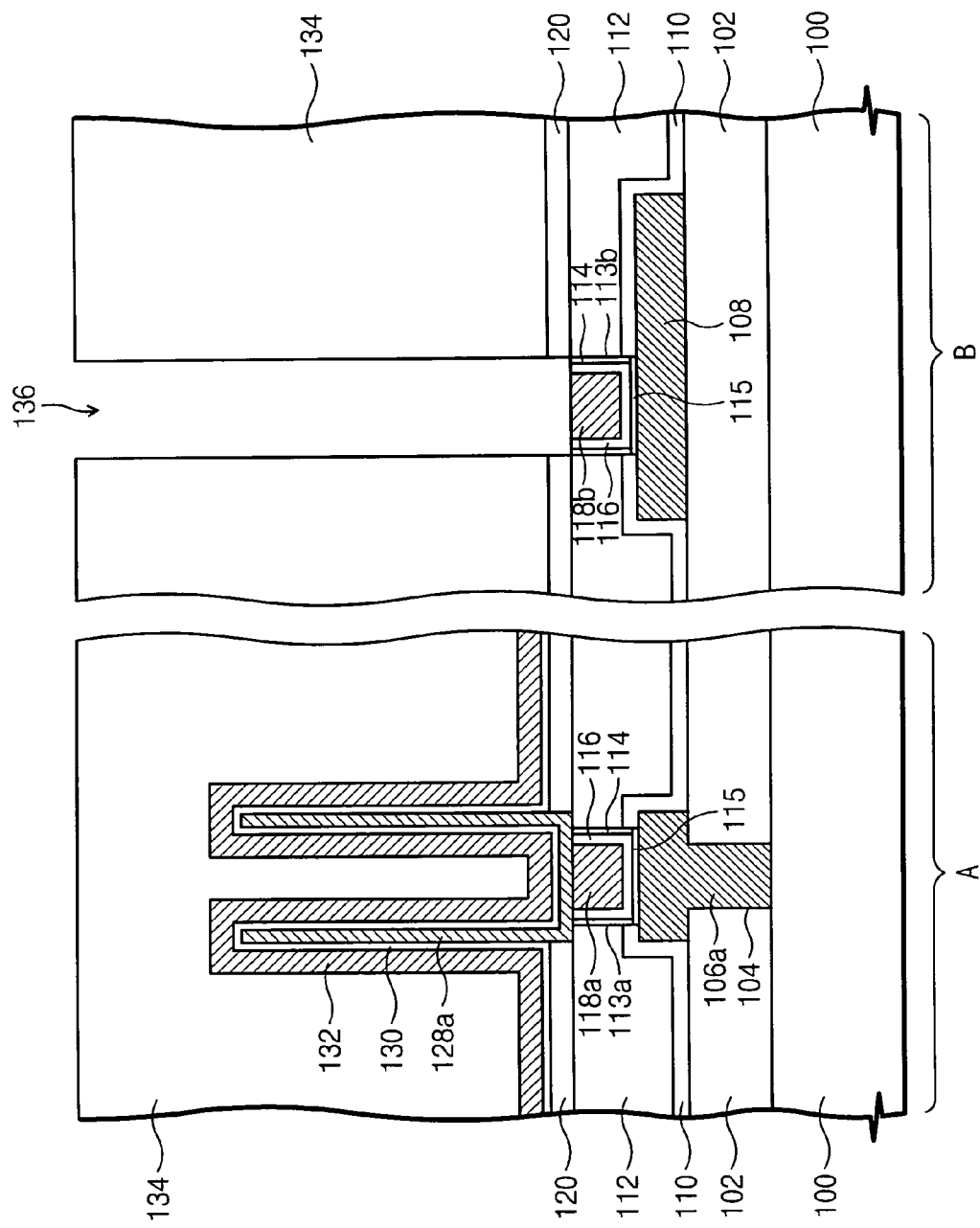

Referring now to FIG. 10, a second interlayer dielectric layer 134 is formed on the capacitor and the second etch stop layer 120. The second interlayer dielectric layer 134 may include, for example, silicon oxide such as HDP having a thickness of about 26000 Å. The second interlayer dielectric layer 134 and the second etch stop layer 120 are patterned to form a metal contact hole 136 exposing the second pad contact plug 118b in the peripheral circuit region B.

In a subsequent process, a second adhesion layer 138 (FIG. 2) is formed on inner sidewalls of the metal contact hole 136, and a third conductive layer fills the metal contact hole 136 to form a metal contact plug 140. At this time, the second adhesion layer 138 may be formed by metal organic chemical vapor deposition (MOCVD) or atomic layer deposition (ALD). In embodiments of the present invention where the second adhesion layer 138 is formed by MOCVD, the process temperature may be from about 300 to about 400 degrees Celsius. In embodiments of the present invention where the second adhesion layer 138 is formed by ALD, the process temperature may be from about 450 to about 550 degrees Celsius.

As briefly discussed above with respect to FIGS. 2 through 10, integrated circuit devices and related methods according to embodiments of the present invention, provide an buried contact plug and a resistor that may include the same material, which may simplify the overall fabrication process of the integrated circuit device. Furthermore, since an ohmic layer is formed at a temperature higher than 600 degrees Celsius before the capacitor is formed, it may be possible to reduce the likelihood of having an increase in a leakage current of the capacitor.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming an integrated circuit device comprising:

forming a buried contact plug on a cell array region of an integrated circuit substrate and forming a resistor on a peripheral circuit region of the integrated circuit substrate, simultaneously;

forming a first pad contact plug on the buried contact plug and forming a second pad contact plug on the resistor, simultaneously;

forming an ohmic layer between the first pad contact plug and the buried contact plug and between the second pad contact plug and the resistor; and forming a metal contact plug on the second pad contact plug in the peripheral circuit region.

2. The method of claim 1, wherein forming the ohmic layer is followed by:

forming a capacitor including a lower electrode on the first pad contact plug, a capacitor dielectric layer on the lower electrode, and an upper electrode on the capacitor dielectric layer.

3. The method of claim 2, wherein forming the capacitor is preceded by:

forming a lower interlayer dielectric layer on the integrated circuit substrate, wherein the lower interlayer dielectric layer defines a contact hole in the cell array region, wherein the buried contact plug is disposed in the contact hole and wherein the resistor is disposed on the lower interlayer dielectric layer; and forming a first interlayer dielectric layer on the lower interlayer dielectric layer, the buried contact plug and the resistor, wherein the first interlayer dielectric layer defines a first pad contact hole in the cell array region and a second pad contact hole in the peripheral circuit region and wherein the first and second pad contact plugs are disposed in the first and second pad contact holes, respectively.

4. The method of claim 3, wherein forming the metal contact plug further comprises:

forming a second interlayer dielectric layer on the capacitor and the first interlayer dielectric layer, the second interlayer dielectric layer defining a metal contact hole in the peripheral circuit region; and forming the metal contact plug in the metal contact hole in the peripheral circuit region.

5. The method of claim 4, further comprising forming an etch stop layer between the first interlayer dielectric layer and the second interlayer dielectric layer.

6. The method of claim 4, further comprising:
forming a first adhesion layer between the first pad contact plug and the first interlayer dielectric layer, between the first pad contact plug and the buried contact plug, between the second pad contact plug and the first interlayer dielectric layer, and between the second pad contact plug and the resistor; and
forming a second adhesion layer between the metal contact plug and the second interlayer dielectric layer and between the metal contact plug and the second pad contact plug.

7. A method of forming an integrated circuit device comprising:
forming an ohmic layer between a first pad contact plug and a buried contact plug in a cell array region of an integrated circuit substrate and between a second pad contact plug and a resistor in a peripheral circuit region of the integrated circuit substrate; and then
forming a capacitor on the first pad contact plug in the cell array region of the integrated circuit substrate; and
forming a metal contact plug on the second pad contact plug in the peripheral circuit region.

8. The method of claim 7, wherein forming the capacitor comprises:
forming a lower electrode on the first pad contact plug;
forming a capacitor dielectric layer on the lower electrode; and
forming an upper electrode on the capacitor dielectric layer.

9. The method of claim 7, wherein forming the capacitor is preceded by:
forming the buried contact plug on the cell array region of the integrated circuit substrate;
forming the resistor on the peripheral circuit region of the integrated circuit substrate;
forming the first pad contact plug on the buried contact plug in the cell array region; and
forming the second pad contact plug on the resistor in the peripheral circuit region.

10. The method of claim 9, wherein forming the capacitor is further preceded by:
forming a lower interlayer dielectric layer on the integrated circuit substrate, wherein the lower interlayer dielectric layer defines a contact hole in the cell array region, wherein the buried contact plug is disposed in the contact hole and wherein the resistor is disposed on the lower interlayer dielectric layer; and
forming a first interlayer dielectric layer on the lower interlayer dielectric layer, the buried contact plug and the resistor, wherein the first interlayer dielectric layer defines a first pad contact hole in the cell array region and a second pad contact hole in the peripheral circuit region and wherein the first and second pad contact plugs are disposed in the first and second pad contact holes, respectively.

11. The method of claim 10, wherein forming the metal contact plug further comprises:
forming a second interlayer dielectric layer on the capacitor and the first interlayer dielectric layer, the second interlayer dielectric layer defining a metal contact hole in the peripheral circuit region; and forming the metal contact plug in the metal contact hole in the peripheral circuit region.

12. The method of claim 11, further comprising forming an etch stop layer between the first interlayer dielectric layer and the second interlayer dielectric layer.

13. A method of forming an integrated circuit device comprising:
forming a lower interlayer dielectric layer on the integrated circuit substrate, the lower interlayer dielectric layer defining a contact hole exposing the integrated circuit substrate in a cell array region of the integrated circuit;
forming a first conductive layer in the contact hole and on the surface of the integrated circuit substrate;
patterning the first conductive layer to provide a buried contact plug in the contact hole in the cell array region and a resistor on the lower interlayer dielectric layer in a peripheral circuit region of the integrated circuit substrate;
forming a first interlayer dielectric layer on the buried contact plug and the resistor;
patterning the first interlayer dielectric layer to provide a first pad contact hole exposing the buried contact plug and a second pad contact hole exposing at least a portion of the resistor;
forming an ohmic layer on floors of the first and second pad contact holes; and
forming a metal contact plug on the ohmic layer in the peripheral circuit region.

14. A method of claim 13, further comprising:
forming a second conductive layer on the ohmic layer and in the first and second pad contact holes;
planarizing the second conductive layer to expose the first interlayer dielectric layer and to provide a first pad contact plug in the first pad contact hole and a second pad contact plug in the second pad contact hole;
forming a first etch stop layer on the first pad contact plug, the second pad contact plug and the first interlayer dielectric layer;
forming a capacitor including an upper electrode, a capacitor dielectric layer and a lower electrode on the first pad contact plug;
forming a second interlayer dielectric layer on a surface of the integrated circuit substrate;
patterning the second interlayer dielectric layer to provide a metal contact hole exposing the second pad contact plug in the peripheral circuit region; and
forming a third conductive layer in the metal contact hole to provide the metal contact plug.

15. The method of claim 14, further comprising forming a second etch stop layer on the integrated circuit substrate before forming the second interlayer dielectric layer.

16. The method of claim 14, wherein forming an ohmic layer comprises:
forming a metal layer on the floors of the first pad contact hole and the second pad contact hole;
thermally treating the metal layer to form the ohmic layer between the metal layer and the buried contact plug and between the metal layer and the resistor.

17. The method of claim 16, wherein the thermal treatment is performed at a temperature of from about 600 to about 900 degrees Celsius for from about 10 to about 30 seconds.

18. The method of claim 14, wherein forming the second conductive layer is preceded by forming a first adhesion layer in the first pad contact hole and the second pad contact hole; and wherein forming the third conductive layer is preceded by forming a second adhesion layer in the metal contact hole.

19. The method of claim 14, wherein forming a capacitor comprises:
   forming a mold layer on the first etch stop layer;
   patterning the mold layer and the etch stop layer in the cell array region to form a storage node hole exposing the first pad contact plug;
   forming a lower electrode layer on a surface of the integrated circuit substrate having the storage node hole;
   forming a sacrificial layer in the storage node hole;
   removing the lower electrode layer and the sacrificial layer on the mold layer by a planarization process to provide a lower electrode and a sacrificial pattern in the storage node hole;
   removing the sacrificial pattern and the mold layer;
   forming a dielectric layer and an upper electrode layer on the integrated circuit substrate having the lower electrode; and
   removing at least the upper electrode layer in the peripheral circuit region of the integrated circuit substrate.

* * * * *